（12）United States Patent
Yanase et al.

(10) Patent No.: US 7,161,806 B2
(45) Date of Patent: Jan. 9, 2007

(54) HEAT SINK AND METHOD FOR ITS PRODUCTION

(75) Inventors: Atsushi Yanase, Tokyo (JP); Masato Takahashi, Tokyo (JP); Yukihiro Kaneda, Yokohama (JP)

(73) Assignees: Fuji Electric Systems Co., Ltd., Tokyo (JP); Tecnisco, Ltd., Tokyo (JP)

( * ) Notice: Subject to any disclaimer, the term of this patent is extended or adjusted under 35 U.S.C. 154(b) by 94 days.

(21) Appl. No.: 10/938,573

(22) Filed: Sep. 13, 2004

(65) Prior Publication Data

US 2005/0063161 A1 Mar. 24, 2005

(30) Foreign Application Priority Data

Sep. 18, 2003 (JP) ............................. 2003-326045

(51) Int. Cl.
*H05K 7/20* (2006.01)

(52) U.S. Cl. ..................... 361/707; 361/708; 361/709; 361/710; 257/712; 257/737; 228/123.1; 228/180.22

(58) Field of Classification Search ................ 361/689, 361/698, 699, 702–704, 706, 707, 714, 719–724; 257/714–719, 620, 637, 675, 684, 712, 758; 29/890.039, 890.04; 165/80.4, 104.33, 170, 165/185; 174/16.3, 79; 228/123.1, 124.1, 228/120, 180.21, 180.22; 420/512
See application file for complete search history.

(56) References Cited

U.S. PATENT DOCUMENTS

| | | | | |
|---|---|---|---|---|
| 4,418,857 A | * | 12/1983 | Ainslie et al. ............ 228/124.1 |
| 4,975,803 A | * | 12/1990 | Niggemann ................. 361/700 |
| 4,996,116 A | * | 2/1991 | Webster et al. ............. 428/627 |
| 5,016,090 A | * | 5/1991 | Galyon et al. .............. 257/714 |
| 5,088,005 A | * | 2/1992 | Ciaccio ...................... 361/699 |
| 5,197,654 A | * | 3/1993 | Katz et al. ................ 228/124.1 |
| 5,274,920 A | * | 1/1994 | Matthews .............. 29/890.039 |
| 5,453,641 A | * | 9/1995 | Mundinger et al. ......... 257/714 |
| 5,537,328 A | * | 7/1996 | Ito ................................ 716/1 |
| 5,583,317 A | * | 12/1996 | Mennucci et al. ......... 174/16.3 |

(Continued)

FOREIGN PATENT DOCUMENTS

WO    WO00/11922    3/2000

*Primary Examiner*—Michael Datskovskiy
(74) *Attorney, Agent, or Firm*—Oblon, Spivak, McClelland, Maier & Neustadt, P.C.

(57) ABSTRACT

The present invention provides a liquid-cooling type heat sink which has a high pressure-resistibility and is resistible against the corrosion or erosion-corrosion or electrolytic etching, and a method for its production.

The heat sink of the present invention comprises plural base members 21, 31 and 41, the base member being each in plate or block-shape, the base member each having paths 60 shaped on one or both sides of surfaces thereof, and the base members being bonded to each other, wherein a communicating flow path 60*a* including path 60, through holes 61, 62, and 63, is formed for a cooling medium to flow in and out. The base members are bonded to each other with a solder layer 54 made of Au—Sn alloy or Sn, while a coating layer of Au 53 is formed on each of the inner surfaces of the bonded base members. At the time of making a bond between the base members, the coating layer of Au 53 and the solder layer 54 are diffused to each other, resulting in formation of a bond layer of alloy 55 containing at least 91 wt % of Au and at most 9 wt % of Sn.

4 Claims, 9 Drawing Sheets

U.S. PATENT DOCUMENTS

| | | | |
|---|---|---|---|
| 5,794,839 A * | 8/1998 | Kimura et al. | 228/123.1 |
| 5,835,345 A * | 11/1998 | Staskus et al. | 361/699 |
| 5,903,583 A * | 5/1999 | Ullman et al. | 372/35 |
| 6,129,260 A * | 10/2000 | Andrus et al. | 228/120 |
| 6,253,835 B1 * | 7/2001 | Chu et al. | 165/80.4 |
| 6,480,385 B1 * | 11/2002 | Seshan | 361/704 |
| 6,675,875 B1 * | 1/2004 | Vafai et al. | 165/80.4 |
| 6,998,535 B1 * | 2/2006 | Nichol | 174/79 |
| 7,000,684 B1 * | 2/2006 | Kenny et al. | 165/80.4 |
| 7,017,654 B1 * | 3/2006 | Kenny et al. | 165/80.4 |

* cited by examiner

Au-Sn series equilibrium diagram

HEAT SINK AND METHOD FOR ITS PRODUCTION

FIELD OF THE INVENTION

The present invention relates to a heat sink used for dissipation of heat from heat-generating devices, such as a semiconductor device, for example, a semiconductor, laser diode, and a method for its production.

BACKGROUND

The semiconductor device, such as a semiconductor laser diode, which has been used in various fields, makes increased heat generation during operation, and thus heat sinks are generally used for cooling it.

The development of high performance semiconductor devices and the like in recent years, such as one with high brightness and/or high output power, requires higher cooling properties in a heat sink. The durability of such cooling properties are also requires in a heat sink, such that the heat sink stably performs its capability of dissipation of heat from heat-generating devices, such as a semiconductor device, during its long lifetime. To meet these demands, various types of heat sinks are developed.

While the capabilities of the heat sink being further improved, there is a tendency for it to increase in size, thickness, etc., and such heat sink cannot be suitable for some of recent semiconductor devices and the like that become further small in size.

Figure 9:
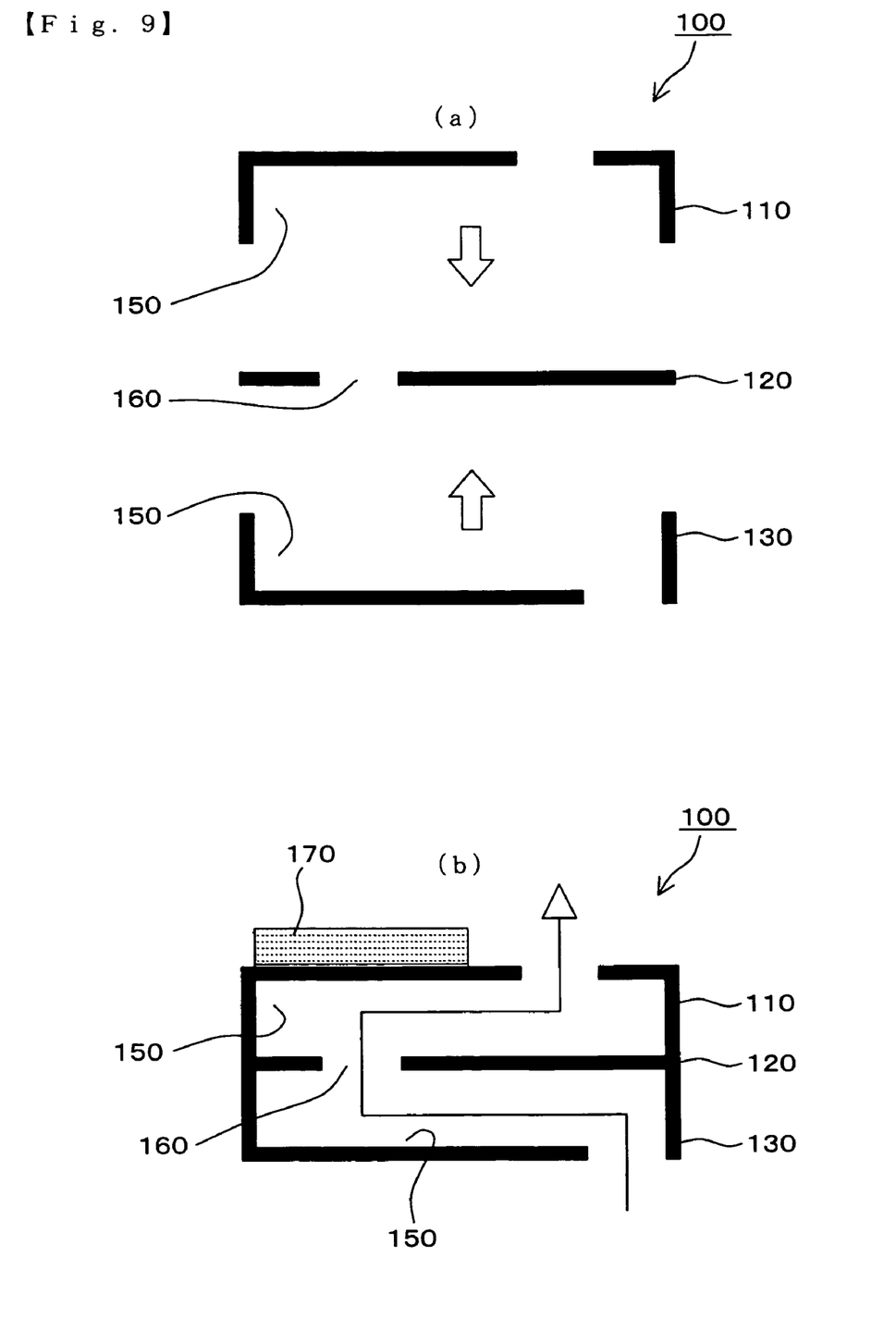
FIG. 9 is a schematic cross sectional view showing an example of a heat sink of prior art.

Accordingly, to solve such problems, WO 00/11922 discloses a structure of heat sink 100 as illustrated with the cross-section view in FIG. 9.

This heat sink 100 comprises base members 110, 120 and 130 that are mainly made of copper in plate-like shapes as illustrated with the cross-section view in FIG. 9a. After the base members being assembled as illustrated with the cross-section view in FIG. 9b, and being bonded by means of adhesion or the like, interspace 150 is formed inside the assembled base members, in which the interspace 150 has boundary of the surfaces of the base members 110, 120 and 130. A through hole 160 is also formed, which communicates one part of interspace 150 created with the base members 110 and 120 to the other part of interspace 150 created with the base members 120 and 130. By allowing a coolant to flow into and to flow out of the thus formed interspace 150 and through hole 160, a semiconductor device 170, such as a semiconductor laser diode, which is mounted onto the outer surface of the base members 110, is cooled by the thus formed heat sink 100.

In the heat sink 100, during a long term circulation of coolant going through the interspace of the heat sink with inflow and outflow, a physical and/or chemical phenomenon such as corrosion or erosion-corrosion occurs on the inner surfaces of the base members 110, 120 and 130 that are in contact with the coolant.

Here, the erosion-corrosion means a mode of corrosion in which a chemical corrosion is accompanied by erosion with mechanical degradation. In the case of the heat sink 100, the chemical corrosion is caused by a chemical reaction between the coolant and the base members 110, 120 and 130, while the mechanical degradation is caused by a mechanical contact of the substances that are contained in the flowing coolant with the inner surfaces of the base members.

The corrosion or erosion-corrosion occurred as mentioned above, causes liquid leakage of the heat sink 100 or reduction of the flow amount of the coolant that is going through the heat sink. As the material for the base members 110, 120 and 130, Cu is generally used, which has excellent thermal conductivity and is relatively low in price. In such an instance, however, corrosion products such as verdigris are formed during a long time circulation of the coolant. The corrosion products cause clogging, and thus lower the flow amount of the coolant that is going through the coolant. Such reduction of the flow amount remarkably decreases the cooling performance of the heat sink.

Further, in a case where a semiconductor laser diode 170 is mounted onto the heat sink 100 to be cooled down, the semiconductor laser diode functions as an electrode (anode or cathode) while the heat sink 100 itself functions as another electrode (cathode or anode). In such case, because of the electric current flowing through the materials of the heat sink 100, as well as through the semiconductor laser diode, the inducement of electrolytic etching is tend to occur. The result from such electrolytic etching is the deformation or clogging of the flow path, further resulting in the reduction of the flow amount of the coolant that is going through the heat sink. In complementing of the reduction of the flow amount by raising the liquid pressure or the like, such pressure often damages the inner surfaces of the heat sink, causing liquid leakage, etc.

To prevent the above problem of the degradation in quality for cooling performance, a coating treatment of the interspace 150 formed inside the heat sink 100, may sometimes be made after bonding of the base members 110, 120 and 130. However, it has been difficult to make a precise coating in an appropriate thickness on the surfaces of the base members creating the interspace 150, in which the coolant flows, so that area of the cross section of the flow path would be in constant shape.

SUMMARY OF THE INVENTION

The present invention has been made in view of such problems, and has an object to provide a heat sink that is resistible against the corrosion or erosion-corrosion or electrolytic etching, and a method for its production.

In order to accomplish the above object, the present invention provides a heat sink for cooling a semiconductor device, comprising: plural base members, the base member being each in plate or block-shape, the base member each having paths shaped on one or both sides of surfaces thereof, and the base members being bonded to each other; a coating layer of Au being onto the members; and a bond layer of alloy containing at least 91 wt % of Au and at most 9 wt % of Sn, the bond layer being interposed between connecting regions at which a pair of the base members is bonded, wherein the paths shaped on surfaces of the base members are connected to each other to form a communicating flow path for a cooling medium inside the bonded base members.

According to the present invention, a layer of Au and/or Au—Sn alloy, metals of which are both excellent in the resistance against corrosion, is formed as a coating or a bond layer on the surfaces including inner surfaces of the bonded base members. Such layer keeps inner surfaces of the bonded base members from being in contact with a cooling medium, whereby it is possible to obtain a heat sink that is resistible against the corrosion or erosion-corrosion or electrolytic etching occurring inside the heat sink.

Further, the base members are bonded with a bond layer of alloy containing at least 91 wt % of Au and at most 9 wt % of Sn, melting point of which is higher than the melting point 278° C. of a usual solder of Au-20% Sn alloy. Accordingly, even in a case where a semiconductor device is bonded onto the outer surface of the heat sink by heating with a solder of Au-20% Sn alloy, the alloy constituting a bond layer is not re-melted at the melting temperature 278° C., which avoids the reduction of the strength of the bond layer.

Further, in the heat sink of the present invention, the base members are preferably made of at least one material selected from the group consisting of Cu, Cu—W type alloy, Mo, Fe—Ni—Co type alloy, aluminum nitride and silicon carbide. Since these base materials are high in the thermal conductivity, the cooling performance of the heat sink can be improved.

In the heat sink of the present invention, the heat sink may further comprise a semiconductor device, wherein the semiconductor device is mounted onto an outer surface of the bonded base member.

Further, in the heat sink of the present invention, the effect of the present invention is remarkable when the semiconductor device is one selected from the group consisting of a single laser emitter, a laser diode array having plural laser emitters aligned in an array form, various types of transistors, and an integrated circuit. Among the semiconductor devices, the single laser emitter, laser diode array having plural laser emitters aligned in an array form, various types of transistors, and integrated circuit, are small in size and large in heat generation per unit area, and therefore these can be cooled efficiently by using the heat sink of the present invention.

Here, in the heat sink of the present invention, it is preferred to include a coating layer of Ni being onto the base members, the coating layer of Ni being overlaid with the coating layer of Au. Since Ni has high adhesion properties to various types of metals including Au, its properties can improve the adhesiveness of both of the layers being onto the base members, and the resistibility against corrosion can also be improved. Further, in the present invention, as the coating method of Ni or Au, usual film-forming methods such as soldering, vapor deposition or sputtering, may be used.

The present invention further provides a method for producing a heat sink for cooling a semiconductor device, comprising the steps of: forming plural base members, the base member being each in plate or block-shape, the base member each having paths shaped on one or both sides of surfaces thereof, and the base member each having connecting regions on one or both sides of surfaces thereof; coating a coating layer of Au onto the base members; putting a solder of Sn or Au—Sn alloy onto connecting regions, the connecting region being coated with the coating layer of Au; assembling the base members together such that the base members are bonding to each other at the connecting region and the paths shaped on each of the surfaces of the base members form a communicating flow path for a cooling medium inside the bonded base members; and heating to diffuse Sn from the solder of Sn or Au—Sn alloy into the coating layer of Au, and to make a bond layer of alloy containing at least 91 wt % of Au and at most 9 wt % of Sn, the bond layer being interposed between connecting regions to which the base member each connects.

According to the method for producing a heat sink in the present invention, after forming the coating layer of Au on each of the surfaces of the base members, when the base members bind to each other with the solder of Sn or Au—Sn alloy, the coating layer of Au and the solder of Sn or Au—Sn alloy are thermally diffused into each other, whereby the component of Au contained in the coating layer of Au is diffused into the solder of Sn or Au—Sn alloy, resulting in increase in the concentration of Au contained in the solder of Sn or Au—Sn alloy. In addition, the component of Sn contained in the solder of Sn or Au—Sn alloy is thermally diffused into the coating layer of Au as well, resulting in formation of a bond layer of alloy containing at least 91 wt % of Au and at most 9 wt % of Sn along the bond lines to which the connecting regions of the base members are adjacent.

The method for producing a heat sink in the present invention may further comprise a step of: coating a coating layer of Ni onto the base members, wherein the coating layer of Ni is overlaid with the coating layer of Au.

In case where the coating layer of Ni, as well as the coating layer of Au, is engaged for coating, a potion of diffusing Sn is attracted to Ni contained in the coating layer of Ni, which is coated over the surfaces of the base members, instead of being attracted to Au. This thermal diffusion between the components results in segregation of a Ni—Sn alloy layer, which is adjacent to the coating layer of Ni. Accordingly, the component of Sn in the solder of Sn or Au—Sn alloy is remarkably reduced, whereby it easily becomes possible to form a bond layer of alloy containing at least 91 wt % of Au and at most 9 wt % of Sn along the bond lines to which the connecting regions of the base members are adjacent.

In the vicinity of the connecting regions of the base members, which comprising of the layer of alloy containing at least 91 wt % of Au and at most 9 wt % of Sn and/or Ni—Sn, the melting point of the alloy layer is not lower than 278° C., the melting point of Au-20 wt % Sn eutectic alloy that is usually used for bonding of semiconductor devices, and the like. Accordingly, when the semiconductor device is bonded by heating onto the surface of the heat sink, the bond layer of alloy does not undergo re-melting by the heat, so that the reduction of the strength of the bond layer of alloy can be avoided. Further, since the coating layer of Au and a solder of Sn or Au—Sn alloy are thermally diffused to each other, and make the bond layer of alloy mainly composed of Au, such heat sink has excellent mechanical strength and properties for a high performance heat sink, in which the bond layer of alloy has both a high thermal conductivity and a high electrical conductivity.

Further, a molten solder flows into the inner surface of the communicating flow path for a cooling medium, being positioned in the vicinity of each connecting position of the base members. As a result, solder fillets, which are deposition of the molten solder formed in an arcuate shape, cover over the corner portions being along the bond lines, at which the communicating flow path changes directions, and at which a pair of inner surfaces of bonded base members is crossed with angle.

Accordingly, even if the pressure of a fluid passing through the communicating flow path is high, the stress onto the corner portions of the bonded surfaces can be relaxed and therefore the resistibility thereof against pressure can be improved, whereby it becomes possible to raise the pressure and increase the flow amount of the coolant and to improve the cooling performance.

In the method for producing a heat sink of the present invention, it is preferred to use a solder of Sn or Au—Sn alloy is in a form of sheet or in vapor phase, and the heating is performed at a temperature not lower than a liquidus line of the solder. According to this method, the amount of the solder to be applied for bonding can be controlled by adjusting the shape or thickness of the sheet, and further the sheet can preliminarily be formed in conformity with the configuration of each of the paths shaped on surfaces of the base members, whereby each layer performs improved adhesion.

Further, the bonding may be carried out in such a manner that a coating layer of the solder of Sn or Au—Sn alloy is made on at least one side of the surfaces to be bonded, and while pressing a pair of the base members toward each other and assembling base members together, the heating is performed at a temperature not lower than a liquidus line of the solder. According to this method, since a coating layer of a solder is preliminarily formed, no complicated management of a solder is required in the steps of the assembling, the heating, and/or the pressing, whereby the costs can be lowered, for example, by avoiding additional steps and/or materials required for the management of a solder. As the coating method thereof, general film formation methods such as plating, vapor deposition or sputtering may be used.

Furthermore, when the heat sink of the present invention is formed, at the time of forming bonding between the base members with the Au—Sn alloy solder or the Sn solder, it is preferred to keep the base members at a temperature of 280 to 600° C. for 1 to 120 minutes under a pressure of 0.1 to 10 MPa.

By conducting the bonding with a solder under the above-mentioned conditions, the solder of Sn or Au—Sn alloy and the coating layer of Au can be sufficiently diffused at the time of forming bonding between the base members. Further, excessive temperature, pressure, or the like, which influences on the qualities of base members and/or the coating layer of Ni, can be avoided, whereby a highly reliable heat sink can be produced.

BEST MODE FOR CARRYING OUT THE INVENTION

Hereinafter, an embodiment of the heat sink of the present invention will be described with reference to the drawings.

Figure 1:
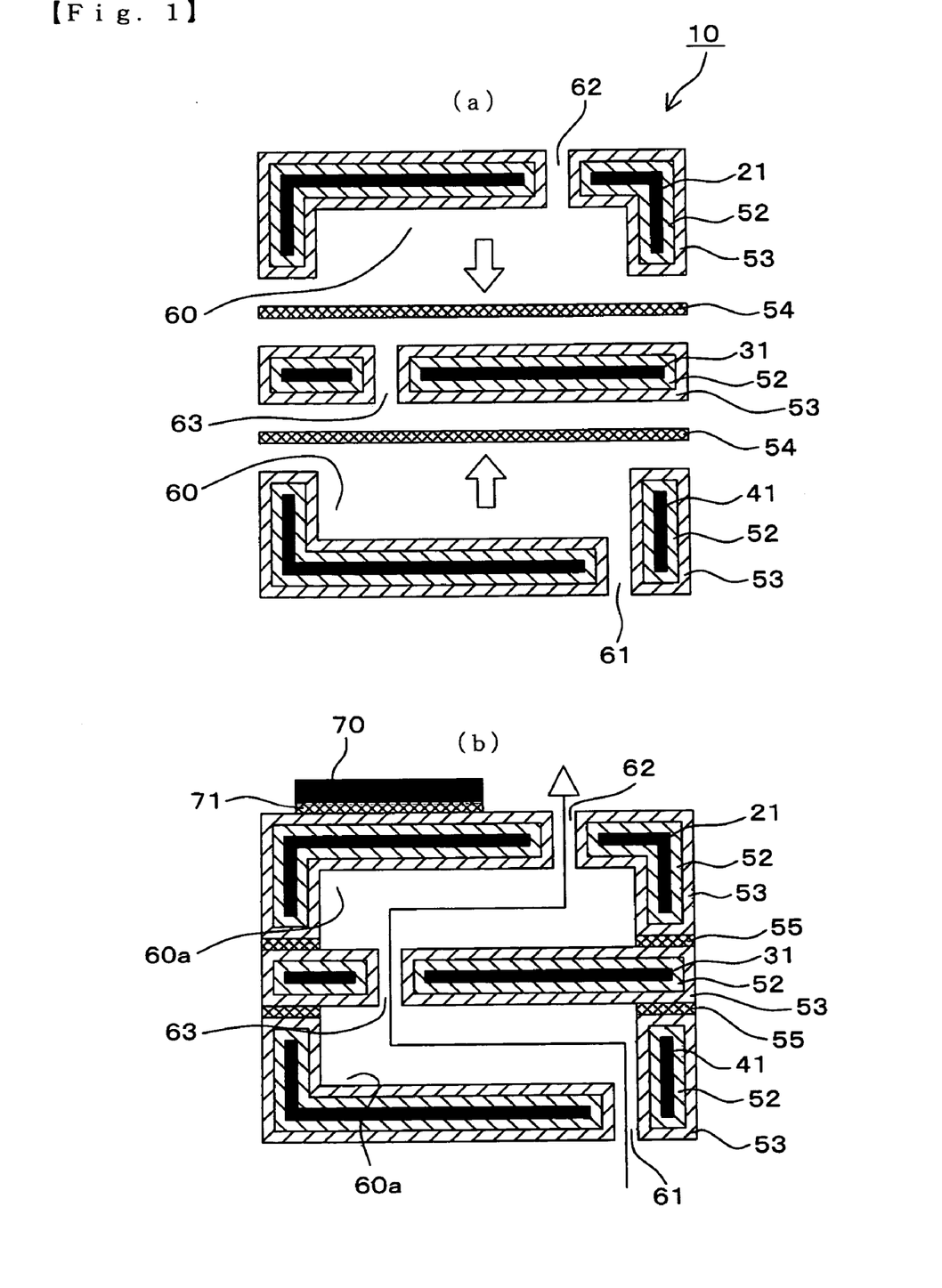
FIG. 1 is a schematic cross sectional view showing a conceptional structure of a heat sink according to the present invention.

The heat sink has three pieces of base members 21, 31 and 41 in a plate-like shape. As the base members 21, 31 and 41, Cu which is a material having excellent thermal conductivity may preferably be used. Cu—W type alloy, Mo, Fe—Ni—Co type alloy, aluminum nitride, etc. may be used as well. These are excellent in thermal conductivity and thus suitable for the base member of the heat sink. When Cu is used, Cu having 99.75 to 99.999% purity which is high in thermal conductivity, is preferably used. Moreover, an electrically conductive single crystal of silicon carbide is useful as the material since it has a higher thermal conductivity (at least 400 W/mK) exceeding pure copper and a thermal expansion coefficient (about 4 to 5 ppm/° C.) near the value of a semiconductor GaAs laser diode (about 6 ppm/° C.). Here, in order to obtain an electric conductivity, a method may be mentioned wherein nitrogen is doped into a substrate and Ni, etc. is used as an electrode layer.

Paths 60 shaped on the base members 21, 31 and 41 and through hole 63 form a communicating flow path 60a when the base members 21, 31 and 41 are bonded. As a method for forming the path 60 and through hole 63, these are formed by use of a processing method such as cutting, a molding method such as casting or forging, or a surface treatment method such as etching.

On the surfaces of the base members 21, 31 and 41, a Ni coating 52 is applied. Ni acts to improve the adhesion to various types of metals. Accordingly, in this embodiment, it is used as an adhesive layer applied between the base member 21 and a coating layer of Au 53 as mentioned below. Further, since Ni is excellent in the resistance against corrosion as well, the resistibility against corrosion of the base member 21 made of material such as Cu, can be improved. This coating layer of Ni 52 can be formed by a surface treatment method such as plating, flame spraying or vapor deposition. As the thickness of the coating, about a few tens nm to 5 μm is preferred.

Over the coating layer of Ni 52, a Au coating 53 is applied. Since Au is a stable metal having a minimum ionization tendency, its resistibility against corrosion is high and it can effectively prevent corrosion, erosion-corrosion or electrolytic etching which usually occurs in the heat sink 10. Further, since its thermal conductivity is high as well, heat exchange can effectively be made. This coating layer of Au 53 can be formed by a surface treatment method such as plating, flame spraying or vapor deposition. As the thickness of the coating, about 0.1 to 5 μm is preferred.

The base members 21, 31 and 41, having the coating layer of Ni 52 and the coating layer of Au 53 as mentioned above, are bonded by the following means.

First, as a treatment prior to the bonding, it is preferred to clean the surfaces of the respective layers to be bonded by a plasma treatment wherein an inert gas, etc. is excited in vacuum to bring about a highly reactive plasma state, and the coating is brought into contact therewith. By this treatment, contaminants which inhibit the diffusion bonding can be removed, whereby a surface to be bonded which has less defects such as failure in bonding or gaps, can be obtained.

Then, between the surfaces of the base members 21, 31 and 41 to be bonded which are cleaned by the plasma treatment, a solder of Au—Sn alloy or a pure Sn solder (hereinafter referred to as "a solder layer") is interposed, and bonding is conducted by heating and melting the solder layer. Here, as the solder of Au—Sn alloy, one having a Au-11.3 to 38.1 wt % Sn composition is preferably used. At the time of bonding through the solder layer, the coating layer of Au coated on respective base members 21, 31 and 41 and the solder layer, are thermally diffused into each other so that the Au—Sn alloy would be formed.

Figure 2:
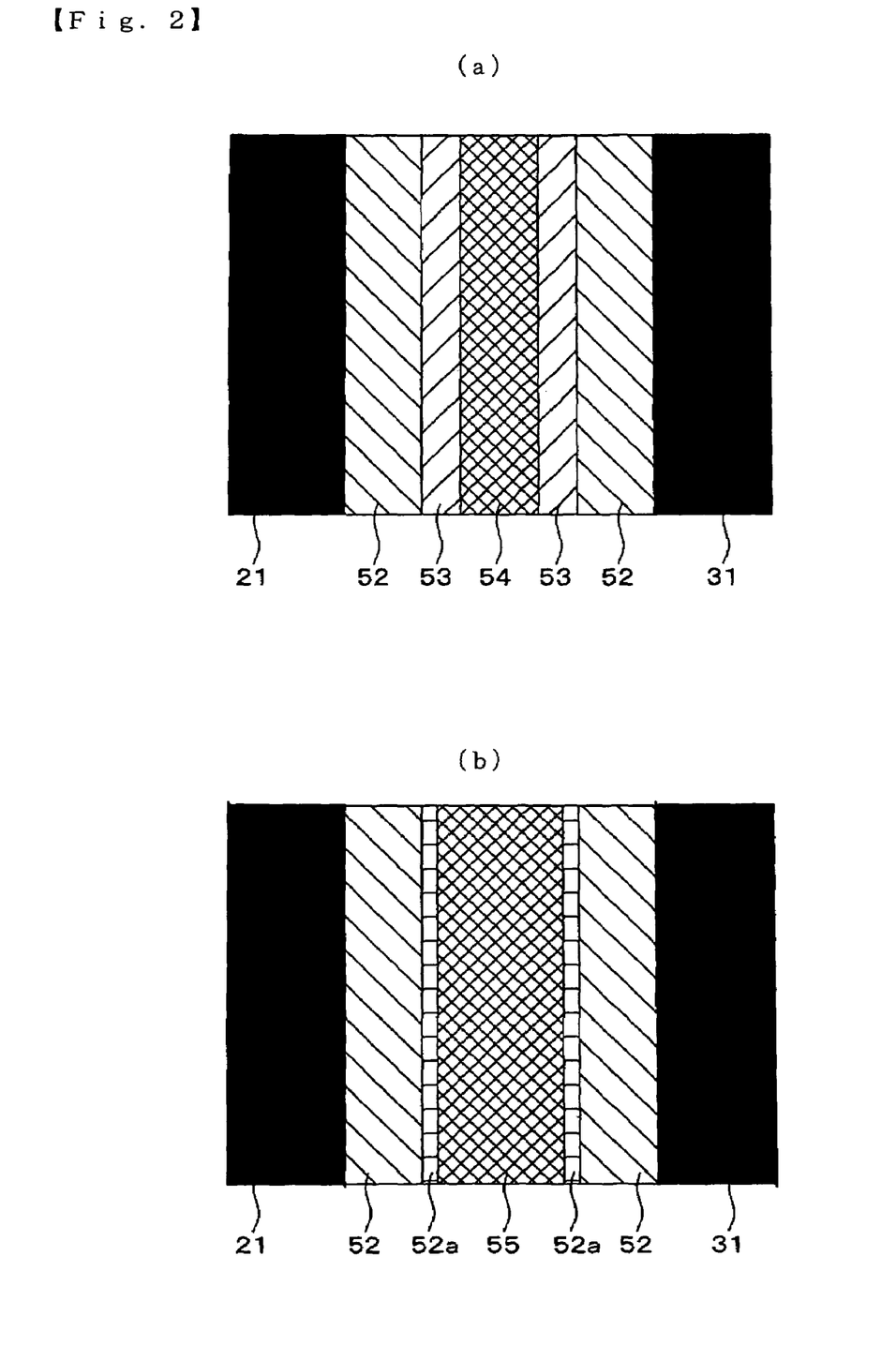
FIG. 2 is a schematic cross sectional view showing a bonded surface of the heat sink.

Namely, FIG. 2(a) shows the state prior to heating, wherein a coating layer of Au 53 formed on the base member 21 over a coating layer of Ni 52 coated on the surface of the base member 21 and a coating layer of Au 53 formed on the base member 31 over a coating layer of Ni 52 coated on the surface of the base member 31, are in contact with each other with a solder layer 54 comprising a Au—Sn alloy or pure Sn.

Under such condition, when heating is conducted to a temperature higher than the melting point of the solder layer 54, the component of Au in the coating layer of Au 53 diffuses into the solder layer 54, and the component of Sn in the solder layer 54 diffuses into the coating layer of Au 53 to form a bond layer of alloy 55, as shown in FIG. 2(b).

At this time, a part of the component of Sn is not diffused together with the component of Au in the coating layer of Au 53, but attracted to Ni which is a component of the coating layer of Ni 52 coated over the surface of the base members, and diffused with Ni to form a Ni—Sn alloy layer 52a. This Ni—Sn alloy layer 52a is segregated adjacent to the coating layer of Ni 52.

As a result, the component of Sn in the Au—Sn alloy layer 54 is remarkably reduced after the thermal diffusion, and a bond layer of alloy 55 of Au—Sn alloy having a high Au content is formed. In the present invention, the compositions of the solder layer and Sn solder or the coating amounts thereof are preliminarily adjusted such that the composition after the bonding would contain at least 91 wt % of Au and at most 9 wt % of Sn, which forms a bond layer of alloy. In this instance, required solder amounts are determined by use of the following formula (1):

$$Au:Sn=(A+B):C=91:9 \text{ (wt \%)} \quad (1)$$

In the formula (1), A is mass of Au in the Au coating 53, B is mass of Au in the solder layer 54, and C is mass of Sn in the solder layer 54. And, the thickness of the Au coating 53 and the used amount of the solder layer 54 are to be determined so that the mass of Sn in the solder layer 54 would be smaller than the mass of C determined by the formula (1).

Here, the bonding of the base members 21, 31 and 41 with a solder layer 54 is preferably conducted by heating them at a temperature higher than a liquidus line of the solder layer 54, more preferably at a temperature of 300 to 600° C. for 1 to 120 minutes. The coating layer of Au 53 and the solder layer 54 are thus diffused uniformly, and a bond layer of alloy 55 containing at least 91 wt % of Au and at most 9 wt % of Sn is thereby formed.

Figure 4:
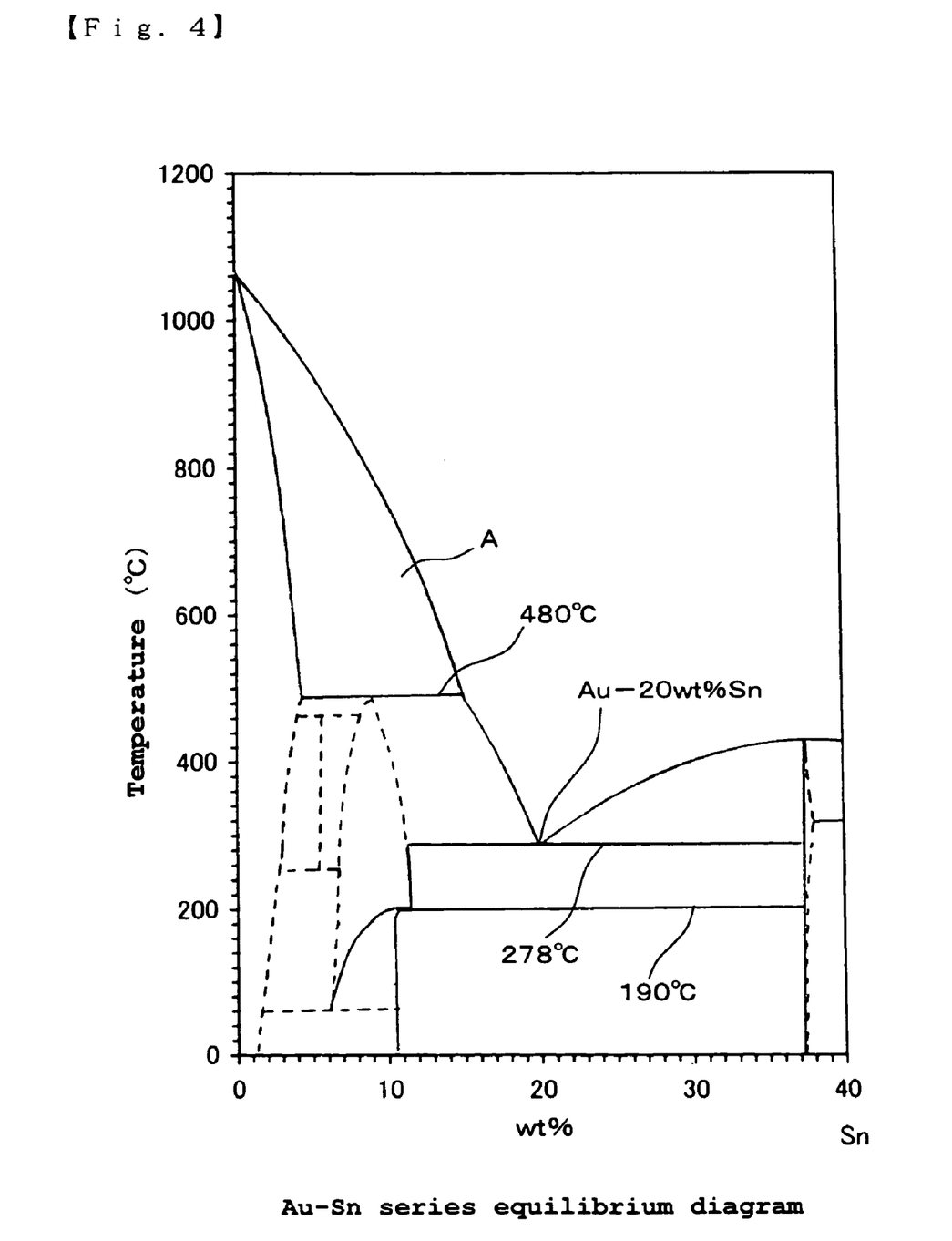
FIG. 4 is an equilibrium diagram of a Au—Sn type alloy.

In the bond layer of alloy 55 of Au—Sn, a solid-liquid coexistence area A begins from 480° C. as shown in a Au—Sn series equilibrium diagram in FIG. 4. As a result, the bond layer of alloy 55 of Au—Sn does not undergo re-melting unless the temperature exceeds 480° C.

Here, the bonding by use of the solder layer 54 is preferably conducted in a reducing atmosphere, in a non-oxidative atmosphere such as nitrogen gas or argon gas, or in vacuum. When the bonding is conducted in vacuum, it is desirable to conduct bonding at a degree of vacuum of at most 0.001 Torr.

As the solder layer 54, various forms may be used.

As one of them, a powdery solder paste may be used, and in such an instance, the paste may be coated on respective base members 21, 31 and 41 by a screen printing method, etc. to form a solder layer. The surface to be coated may be one of the surfaces to be bonded of the base members 21 and 41, or both surfaces to be bonded of the base member 31. In this instance, the solder amount may be adjusted by the coated form or thickness of the paste.

Further, as the solder, a flaky sheet may be used. In this instance also, the solder amount may be adjusted by the form or thickness of the sheet. Particularly, since the sheet can preliminarily be formed in conformity with the shape of the path 60 to be formed in respective layers, the adhesion with respective layers can be improved.

Furthermore, the Au—Sn alloy solder may be coated on the surface to be bonded of the base member by a surface treatment method such as vapor deposition, or Au and Sn may alternately be coated thereon by a surface treatment method such as vapor deposition. By doing the coating in such a manner, it becomes easy to control the compositional ratio or the total amount of the coating layer, and obtain a uniform coating layer. Further, by using a manner such as masking, coating can be made on only required portions with high dimensional precision, whereby the costs can be lowered.

Figure 3:
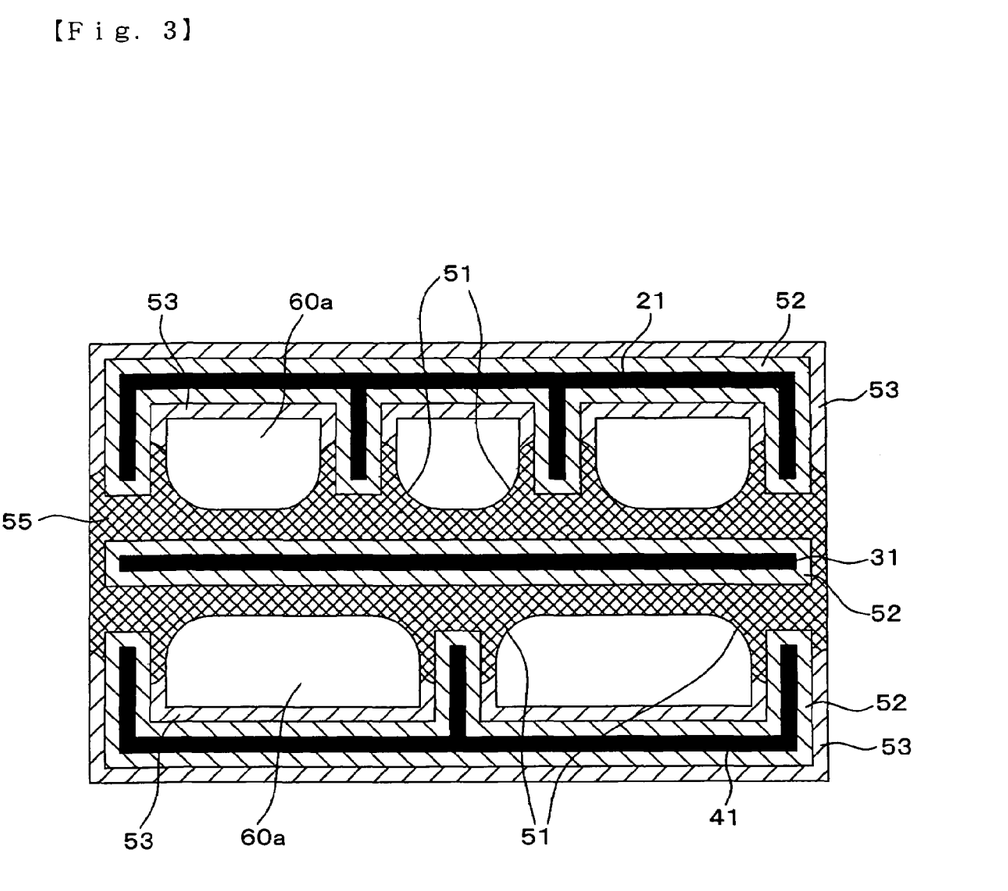
FIG. 3 is a schematic cross sectional view showing a solder fillet formed in a heat sink according to the present invention.

Here, when the base members 21, 31 and 41 are bonded each other with a solder layer 54, molten solder flows into the communicating flow paths 60a respectively formed in the base members 21, 31 and 41, as shown in FIG. 3. At this time, on corner portions at which the direction of the communicating flow path changes or corner portions in the lateral direction of the flow path, solder fillets 51 made of the solder in an arcuate shape are formed. Accordingly, even if the pressure of the fluid in the flow path is high, the stress onto the corner portions of the bonded surfaces can be relaxed by the solder fillets 51 and therefore the pressure-resistibility thereof can be improved. Accordingly, even if the pressure is raised to increase the flow rate of the coolant, it does not bring about breakage of the heat sink and the cooling performance can be improved.

To the thus formed heat sink 10, a semiconductor device 70 is bonded with a solder layer 71. In this instance, for the solder layer 71, the Au—Sn solder or Sn solder as mentioned above may be used. And, when the semiconductor device 70 is bonded by soldering, for example, in the case of a Au—Sn solder, it is required to heat it to a temperature of at least 278° C. which is the liquidus line thereof. However, as mentioned above, since the base members 21, 31 and 41 are bonded with a bond layer of alloy containing at least 91 wt % of Au and at most 9 wt % of Sn, its melting point is as high as 480° C., and no re-melting will be caused by the soldering of the semiconductor device 70. Accordingly, the width of choice of the solders at the time of bonding the semiconductor device can be broadened, and it is possible to prevent deterioration of the strength of the bonded surfaces of the base members 21, 31 and 41 at the time of mounting the device.

EXAMPLE 1

Figure 5:
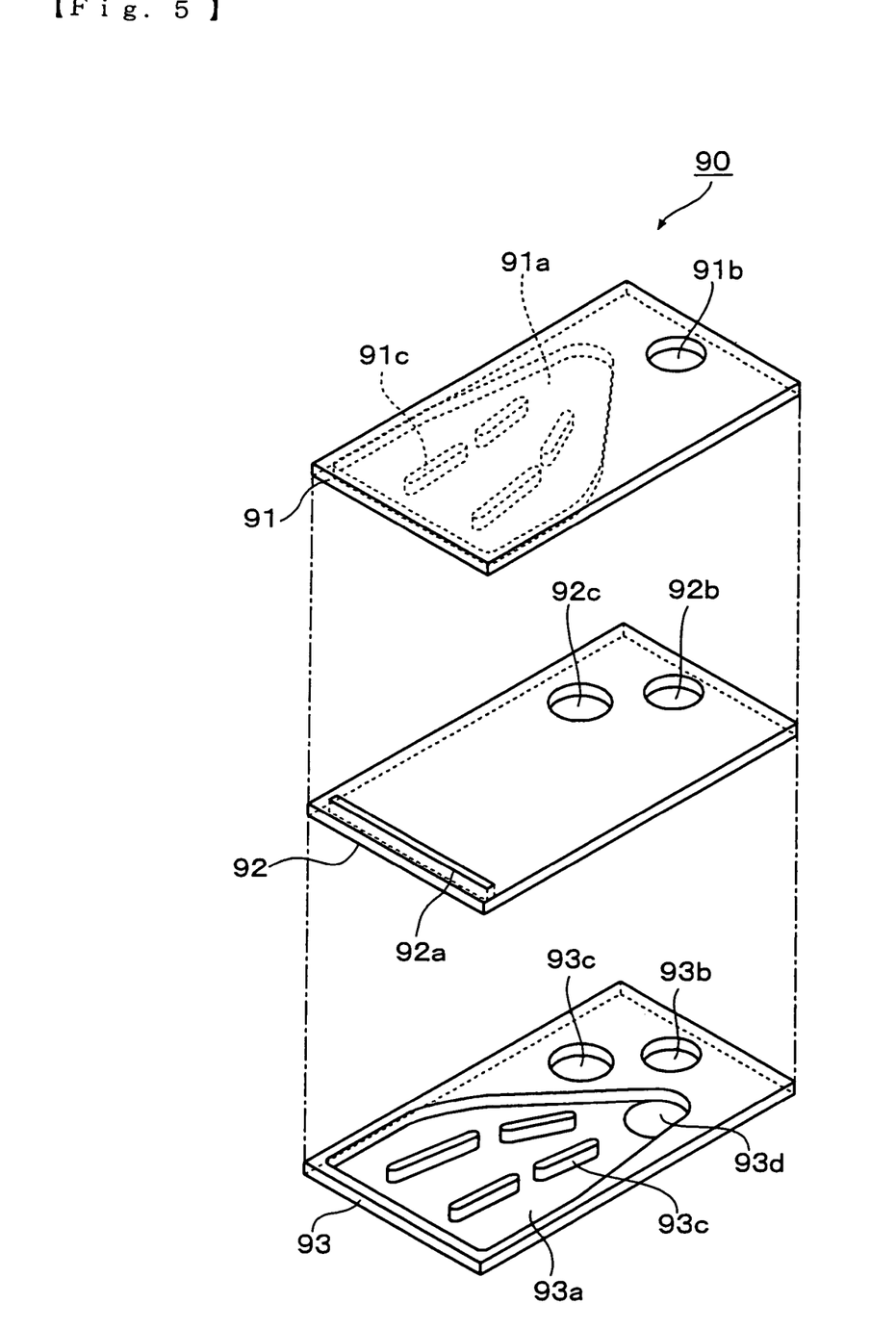
FIG. 5 is an exploded perspective view showing an example of a heat sink according to the present invention.

Using the members as shown in FIG. 5, a heat sink 90 of the present invention was produced. This heat sink 90 was constituted by a first base member 91, a second base member 92 and a third base member 93, which are made of a copper plate-like member of 20 mm in width, 11 mm in height and 0.5 mm in thickness. Inside the respective base members, paths for a coolant are defined.

Namely, the first base member 91 is provided with a half etching portion 91a as a path and a rib 91c for guiding the flow of the coolant, and further an aperture portion 91b. The second base member 92 is provided with a rectangular aperture portion 92a as a path and an aperture portion 92c, and further an aperture portion 92b. The third base member 93 is provided with a half etching portion 93a as a path and an aperture portions 93d and 93c, and further a rib 93e for guiding the flow of the coolant, and furthermore an aperture portion 93b.

As mentioned above, on the surfaces of the respective base members 91, 92 and 93, on which the paths are formed, Ni coatings with a thickness of 5 μm, and further thereon Au coatings with a thickness of 3 μm were formed by plating.

And, plating foils of a Au-20 wt % Sn alloy (thickness: 20 µm) were sandwiched between the respective base members 91, 92 and 93, and it was placed in a reducing furnace or a vacuum furnace and maintained at a temperature higher than the melting point 278° C. of the plating foils for 18 minutes. The peak temperature of heating at this time was 375° C.

A heat sink 90 was thus produced. As the flow of the coolant in the heat sink 90, the coolant flows in the order of the aperture portion 93*d* of the third base member 93, the half etching portion 93*a* thereof, the rectangular aperture portion 92*a* of the second base member, the half etching portion 91*a* of the first base member 91, the aperture portion 92*c* of the second base member 92, and the aperture portion 93*c* of the third base member 93. Further, the aperture portions 91*b*, 92*b* and 93*b* of the respective layers were designed so as to communicate at the time of bonding. These aperture portions had such a function that the heat sink and a water-supplying and discharging device were positioned or fixed by use of a screw or the like with a packing.

TEST EXAMPLE 1

Figure 6:
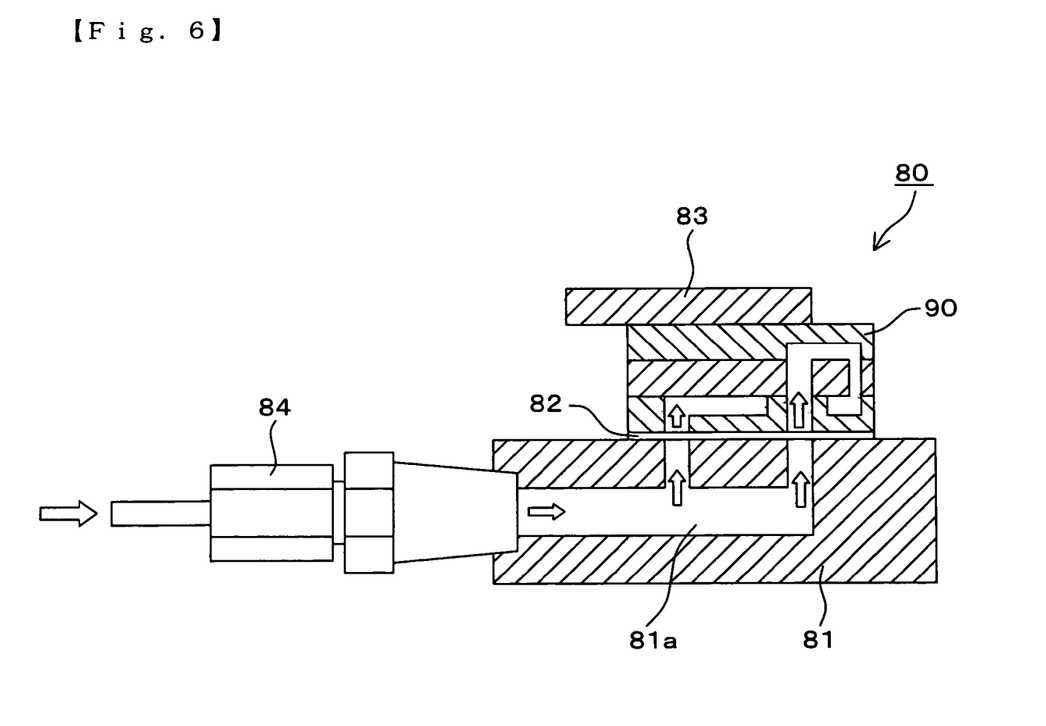
FIG. 6 is an explanatory view showing a pressure-resistibility test method of a heat sink.

A pressure-resistibility test of the heat sink 90 obtained in Example 1 was conducted. FIG. 6 shows a conceptional structure of an apparatus used for this test. In the pressure-resistibility test apparatus 80, onto a manifold 81 having a path 81*a* formed thereon, the heat sink 90 obtained as above was bonded with a bonding layer 82 made of a Au—Sn alloy solder.

In this pressure-resistibility test, test pieces 1 to 5 of five heat sinks 90 were produced. At the upper portion of each of these test pieces 1 to 5 of heat sinks, a tension plate 83 is provided to resist a pressure if the pressure is applied. Then, a pipe joint 84 is coupled with the manifold 81, and through this joint, an oil pressure was given by a hydraulic jack not shown in the drawing. And, a liquid preliminarily charged in the manifold 81 was allowed to flow into the communicating flow path inside the heat sink 90 with a path 81*a* in the manifold, and what portion would be broken by how high pressure was tested.

Figure 7:
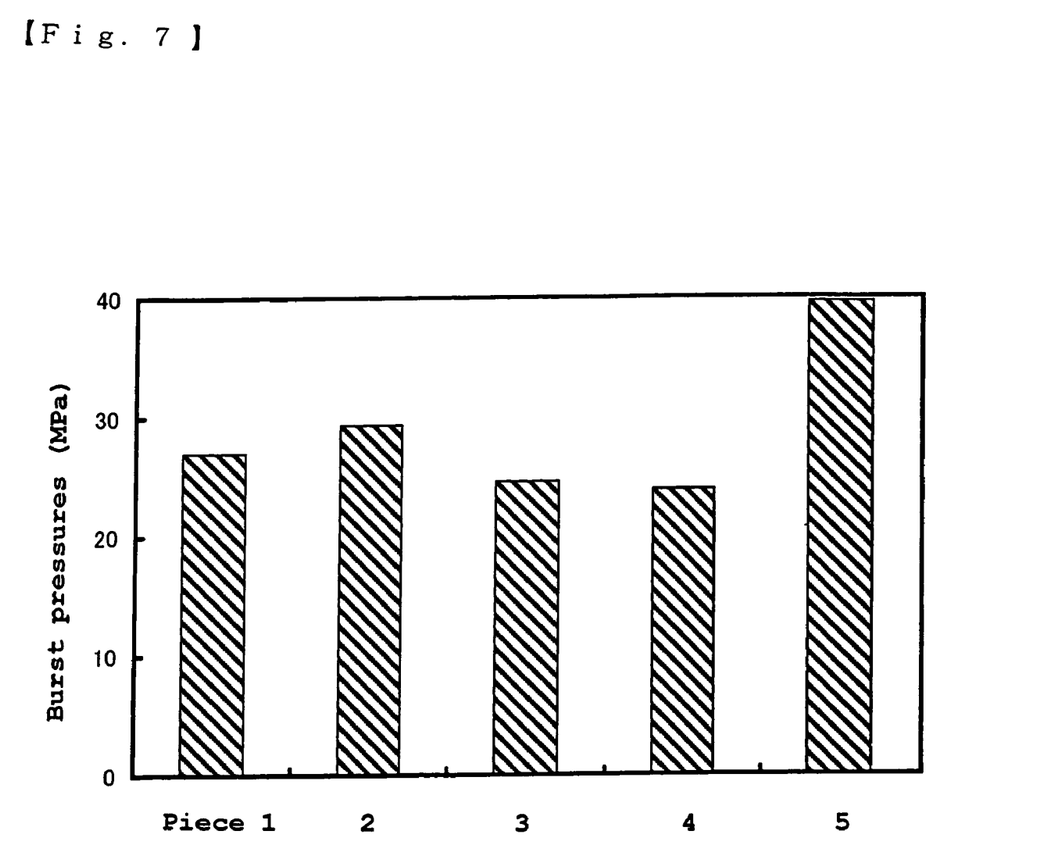
FIG. 7 is a graph showing results of the pressure-resistibility test of a heat sink according to the present invention.

As the result, all breakages occurred at the bonding layer 82 of the Au—Sn alloy, and no breakage was seen at the bonded layers between the base members 91, 92 and 92 of the heat sink 90. The burst pressures of the respective test pieces 1 to 5 thus measured are indicated in FIG. 7. Here, in test piece 2, leakage was observed at the bonding layer 82 with the manifold 81 before breakage, and the pressure at this point was determined as the burst pressure.

From the results of FIG. 7, it can be said that the Au—Sn alloy layer which bonds the respective base members 91, 92 and 93 of the heat sink 90 was firmly bonded.

TEST EXAMPLE 2

Four test pieces of the above heat sink 90 were produced, and the elements of the bond layer of alloy which bonds the respective base members 91, 92 and 93 of the heat sinks 90 were quantitatively analyzed. The results are indicated in Table 1.

TABLE 1

|  | Au (wt %) | Sn (wt %) | Cu (wt %) | Ni (wt %) |
| --- | --- | --- | --- | --- |
| Test piece 1 | 92.50 | 3.95 | 1.18 | 0.91 |
| Test piece 2 | 94.64 | 3.25 | 1.19 | 0.91 |
| Test piece 3 | 95.51 | 3.26 | 1.27 | 1.32 |

TABLE 1-continued

|  | Au (wt %) | Sn (wt %) | Cu (wt %) | Ni (wt %) |
| --- | --- | --- | --- | --- |
| Test piece 4 | 95.71 | 2.79 | 1.53 | 1.76 |
| Average | 94.59 | 3.31 | 1.29 | 1.23 |

From the above results, it is found that the bond layer of alloy which bonds the respective base members 91, 92 and 93 contains 94.59 wt % of Au and 3.31 wt % of Sn on average, i.e. this is an alloy layer containing at least 91 wt % of Au and at most 9 wt % of Sn.

TEST EXAMPLE 3

The following alkali-resistibility test was conducted to confirm the resistibility against corrosion of the heat sink of the present invention.

Test piece 1 was produced by using Cu as a base member, coating a Ni layer in a thickness of 5 µm on the surface of Cu as the base member by electrolytic plating, further coating a Au layer in a thickness of 3 µm on this Ni layer by electrolytic plating, and then mounting a Au—Sn alloy solder foil with a thickness of 20 µm on this Au layer, followed by fusing in a reducing furnace.

Test piece 2 was produced by using Cu as a base member, coating a Ni layer in a thickness of 5 µm on the surface of Cu as the base member by electrolytic plating, and further coating a Au layer in a thickness of 3 µm on this Ni layer by electrolytic plating.

Test piece 3 was produced by using Cu as a base member, and coating a Ni layer in a thickness of 5 µm on the surface of Cu as the base member by electrolytic plating.

As test piece 4, a base member made of Cu alone was used. The dimension of these test pieces 1 to 4 was 50 mm in width, 20 mm in height and 1 mm in thickness.

And, each of the test pieces 1 to 4 were immersed in 200 ml of an aqueous solution of 50 g of sodium carbonate (Na$_2$CO$_3$) dissolved in 1 liter of water, and maintained at 40±1° C. for 144 hours, and then elements eluted in the aqueous solution were analyzed to determine the eluted concentration of Cu.

Figure 8:
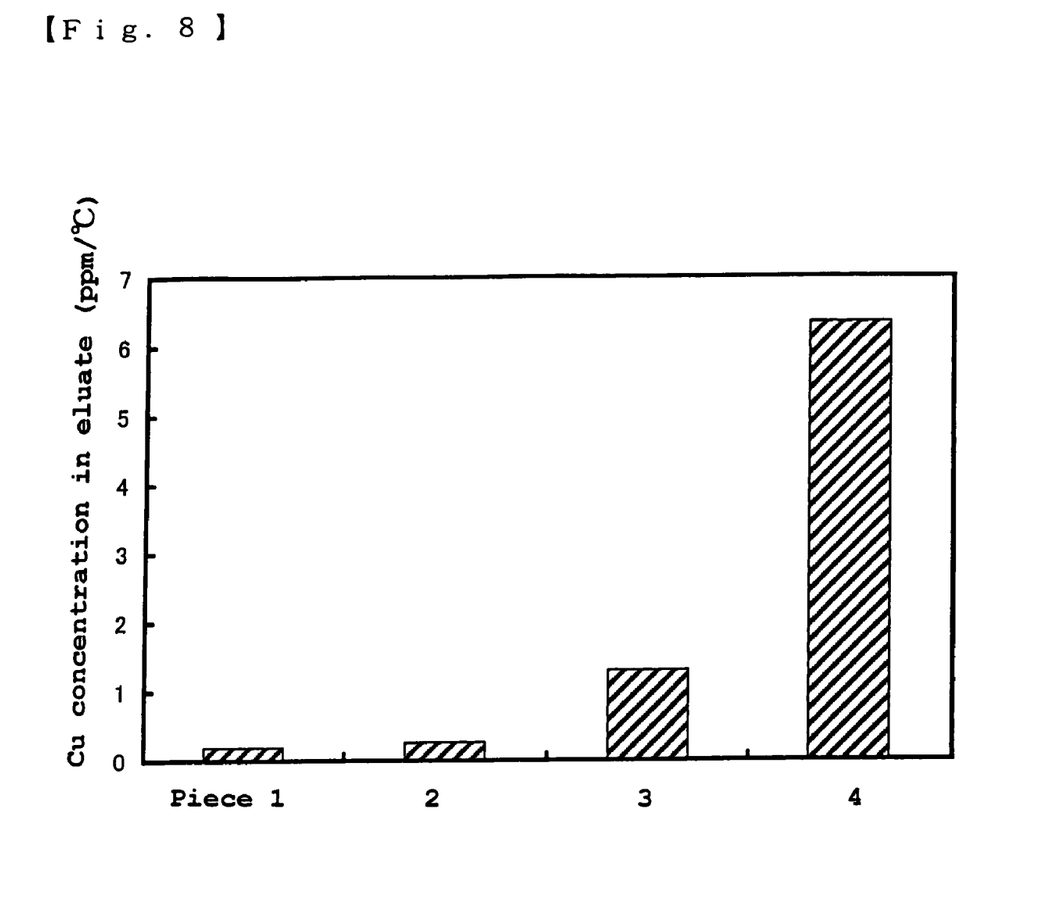
FIG. 8 is a graph showing results of an alkali-resistibility test of a heat sink according to the present invention.

For the elemental analysis, ICP emission spectroanalysis meter (tradename: JY-138 ULTRACE, manufactured by Rigaku Corporation) was used. The detection precision of the analysis meter was set to be 0.03 ppm/° C. The results are indicated in FIG. 8.

From the results, the test piece 1 in which the outer surface is formed by a coating layer of Au, and the test piece 2 in which the outer surface is formed by a layer of Au—Sn alloy, show remarkably small amounts of Cu eluted as compared with the test pieces 3 and 4, namely it is found that the resistibility against corrosion was each improved.

ADVANTAGES OF THE PRESENT INVENTION

According to the present invention, since a highly corrosion-resistant Au is employed as a material for the coating layer on the base members constituting the heat sink, it is possible to produce a heat sink that is resistible against the corrosion or erosion-corrosion or electrolytic etching occurring on the inner surfaces of the heat sink.

Further, according to the present invention, the component of Au contained in the coating layer of Au is thermally diffused into the solder of Sn or Au—Sn alloy, resulting in increase in the concentration of Au contained in the solder of Sn or Au—Sn alloy. In addition, the component of Sn contained in the solder of Sn or Au—Sn alloy is thermally diffused into the coating layer of Au as well. However, In case where the coating layer of Ni, as well as the coating layer of Au, is engaged for coating, a potion of diffusing Sn is attracted to Ni contained in the coating layer of Ni, which is coated over the surfaces of the base members, instead of being attracted to Au. This thermal diffusion between the components results in segregation of a Ni—Sn alloy layer, which is adjacent to the coating layer of Ni. Accordingly, the component of Sn in the solder of Sn or Au—Sn alloy is remarkably reduced, whereby a bond layer of alloy containing at least 91 wt % of Au and at most 9 wt % of Sn can be formed along the bond lines to which the connecting regions of the base members are adjacent. Such bond layer of alloy containing at least 91 wt % of Au and at most 9 wt % of Sn is advantageous for mounting a semiconductor device and/or a sub mount (a part sandwiched between the semiconductor device and the heat sink; e.g. a CuW10 or CuW type alloy) onto the surface of the heat sink by heating, since the bond layer of alloy does not undergo re-melting at the melting point 278° C. of a usual solder of Au-20% Sn alloy, so that the reduction of the strength of the bond layer of alloy, on formation of bonding between the devices, can be avoided.

The heat sink of the present invention can be utilized industrially as a heat dissipation means for semiconductor devices such as a semiconductor laser diode.

What is claimed is:

1. A heat sink for cooling a semiconductor device, comprising:

plural base members, the base member being each in plate or block-shape, the base member each having paths shaped on one or both sides of surfaces thereof, and the base members being bonded to each other;

a coating layer of Au being onto the members; and a bond layer of alloy containing at least 91 wt % of Au and at most 9 wt % of Sn, the bond layer being interposed between connecting regions at which a pair of the base members is bonded, wherein the paths shaped on surfaces of the base members are connected to each other to form a communicating flow path for a cooling medium inside the bonded base members.

2. The heat sink according to claim 1, wherein the base members are made of at least one material selected from the group consisting of Cu, Cu—W type alloy, Mo, Fe—Ni—Co type alloy, aluminum nitride and silicon carbide.

3. The heat sink according to claim 1, further comprising a semiconductor device, wherein the semiconductor device is one selected from the group consisting of a single laser emitter, a laser diode array having plural laser emitters aligned in an array form, various types of transistors, and an integrated circuit.

4. The heat sink according to claim 1, further comprising a coating layer of Ni being onto the base members, the coating layer of Ni being overlaid with the coating layer of Au.

* * * * *